US012598897B2

(12) United States Patent
Watanabe

(10) Patent No.: US 12,598,897 B2
(45) Date of Patent: Apr. 7, 2026

(54) DISPLAY DEVICE

(71) Applicant: Sharp Display Technology Corporation, Kameyama City (JP)

(72) Inventor: Noriko Watanabe, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 296 days.

(21) Appl. No.: 18/682,116

(22) PCT Filed: Oct. 11, 2021

(86) PCT No.: PCT/JP2021/037580
§ 371 (c)(1),
(2) Date: Feb. 8, 2024

(87) PCT Pub. No.: WO2023/062683
PCT Pub. Date: Apr. 20, 2023

(65) Prior Publication Data
US 2024/0373723 A1      Nov. 7, 2024

(51) Int. Cl.
*H10K 59/80* (2023.01)
*G02B 1/118* (2015.01)
*H10K 77/10* (2023.01)
*H10K 102/00* (2023.01)

(52) U.S. Cl.
CPC ........... *H10K 59/875* (2023.02); *G02B 1/118* (2013.01); *H10K 77/111* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 10,153,461 B1 * | 12/2018 | Liu | H10K 59/40 |
| 2004/0027702 A1 * | 2/2004 | Matsushita | G02F 1/133553 |
| | | | 359/883 |
| 2009/0273581 A1 * | 11/2009 | Kim | G02F 1/13338 |
| | | | 345/175 |
| 2011/0117731 A1 * | 5/2011 | Park | C23C 14/048 |
| | | | 250/515.1 |
| 2011/0228401 A1 * | 9/2011 | Fukushima | H04N 5/72 |
| | | | 359/609 |

FOREIGN PATENT DOCUMENTS

| | | |
|---|---|---|
| JP | 2009-271531 A | 11/2009 |
| JP | 2010-122481 A | 6/2010 |
| WO | 2010/055564 A1 | 5/2010 |

* cited by examiner

*Primary Examiner* — Ryan Crockett
(74) *Attorney, Agent, or Firm* — ScienBiziP, P.C.

(57) ABSTRACT

The relative positions of a first low-reflection layer and a second low-reflection layer are variable in a bendable portion. A main low-reflection structure has, on a surface facing a secondary low-reflection structure, an asperity pattern and a moth-eye structure. The asperity pattern has a sine-wave shaped surface in a sectional view. A single period of a sine wave constituting the sine-wave shaped surface is equal to an integral multiple of the width of a single pixel of a display device in a direction where the asperity pattern is arranged.

6 Claims, 4 Drawing Sheets

NON-BENT STATE                    BENT STATE

DISPLAY DEVICE

TECHNICAL FIELD

The disclosure relates to a display device.

BACKGROUND ART

Bendable display devices have been known.

CITATION LIST

Patent Literature

Patent Literature 1: Japanese Unexamined Patent Application Publication No. 2009-271531

Patent Literature 2: Japanese Unexamined Patent Application Publication No. 2010-122481

Patent Literature 3: International Publication No. 2010/055564

SUMMARY

Technical Problem

By the way, a typical bendable display device is provided with a bendable display device body having a display surface, and a bendable cover member covering the display surface.

In some cases, a bendable display device has a gap formed between the display device body and the cover member in order to avoid a break in the display device. The following problem possibly occurs in such a display device during its bending.

There is a large difference between the light reflectance at an intimate-contact portion where the display device body and the cover member are in intimate contact, and the light reflectance at a non-intimate-contact portion where the display device body and the cover member are not in intimate contact. Hence, light reflected at the intimate-contact portion and light reflected at the non-intimate-contact portion are recognized individually by an observer of the display device; that is, display uniformity is reduced. This degrades display quality.

Solution to Problem

A display device according to one aspect of the disclosure is a display device including a bendable portion that is bendable. The display device includes the following: a display device body having a display surface, and having a first low-reflection layer constituting the display surface; and a cover member covering the display surface, and having a second low-reflection layer facing the first low-reflection layer, wherein the relative positions of the first low-reflection layer and the second low-reflection layer are variable in the bendable portion, a main low-reflection structure has, on a surface facing a secondary low-reflection structure, a first asperity pattern and a first moth-eye structure provided on a surface of the first asperity pattern, the main low-reflection structure being one of the first low-reflection layer and the second low-reflection layer, the secondary low-reflection structure being another of the first low-reflection layer and the second low-reflection layer, the second low-reflection layer, the first asperity pattern has a first sine-wave shaped surface in a sectional view, and a single period of a sine wave constituting the first sine-wave shaped surface is equal to an integral multiple of the width of a single pixel of the display device in a direction where the first asperity pattern is arranged.

Advantageous Effect of Invention

The aspect of the disclosure can achieve a display device of high display quality.

DESCRIPTION OF EMBODIMENTS

Embodiments of the disclosure will be described. It is noted that for convenience in description, components having the same functions as those of earlier described components will be denoted by the same signs, and that their description will not be repeated in some cases.

Figure 1:
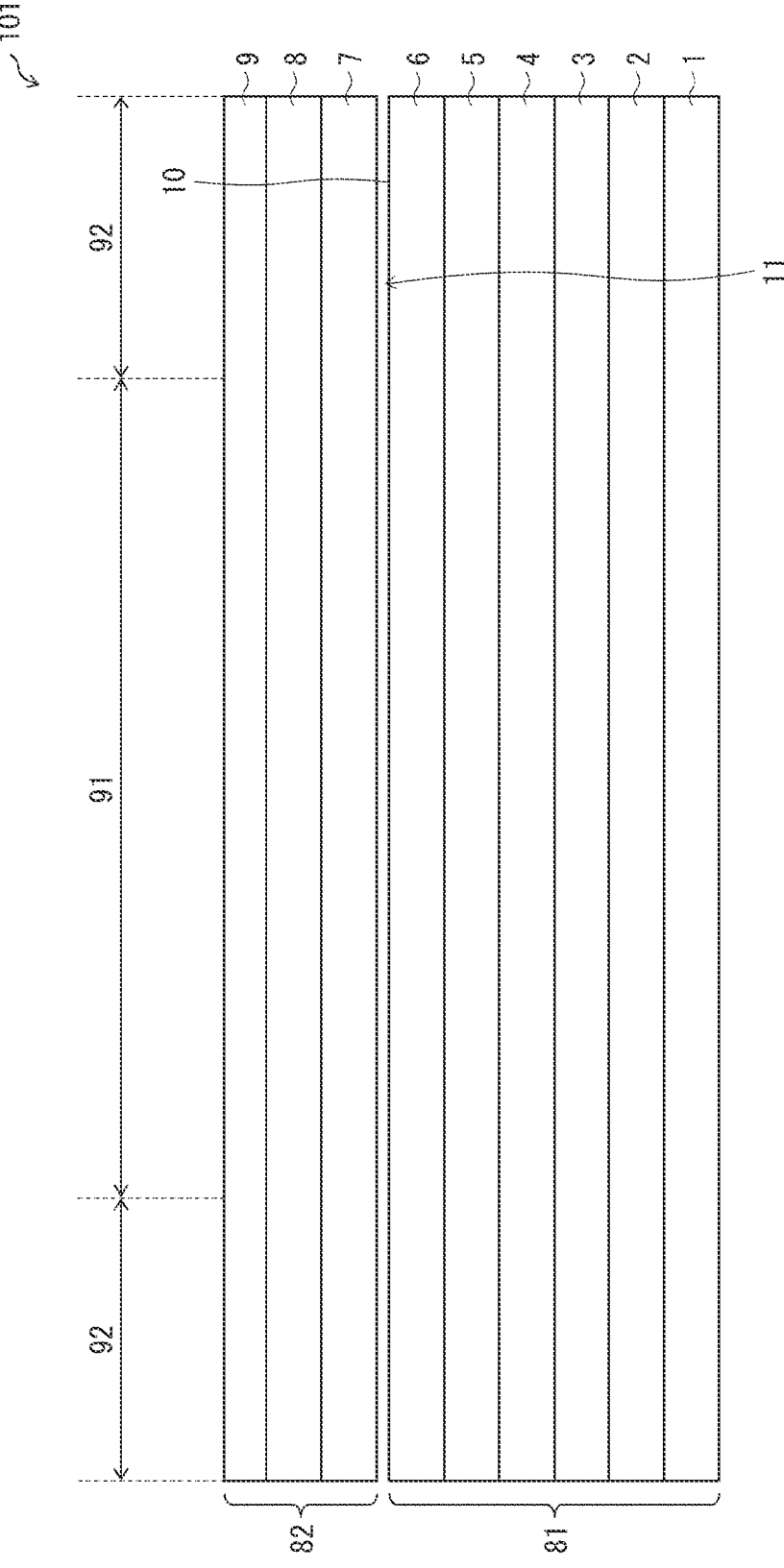
FIG. 1 is a sectional view of the schematic configuration of a display device according to a first embodiment of the disclosure.
Figure 2:
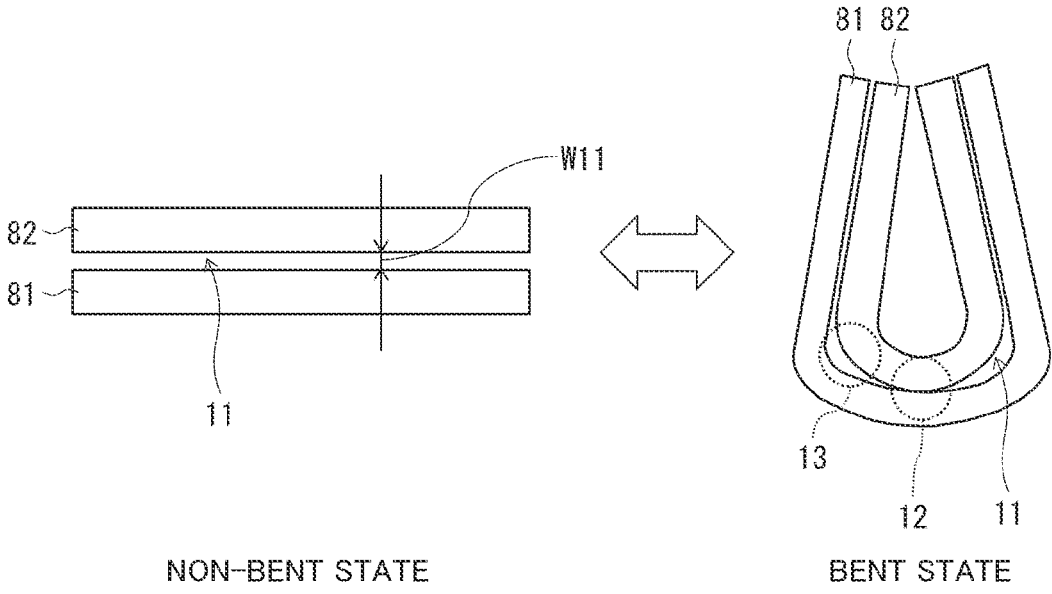
FIG. 2 is a sectional view of the display device illustrated in FIG. 1 in comparison between its non-bent state and bent state.

FIG. 1 is a sectional view of the schematic configuration of a display device 101 according to this embodiment. FIG. 2 is a sectional view of the display device 101 in comparison between its non-bent state and bent state.

First Embodiment

The display device 101 is a bendable display device. The display device 101 specifically includes a bendable portion 91 and a hard-to-bend portion 92. The bendable portion 91 is a portion that is flexible and bendable. The hard-to-bend portion 92 is a portion that is inflexible and hard to bend. It is noted that the words bendable and hard-to-bend respectively means "bendable" and "not bendable" at least within the scope of a conceivable method of using the display device 101.

The display device 101 includes a display device body 81 and a cover member 82.

The display device body 81 has a display panel 1, an adhesive 2, a touch panel 3, an adhesive 4, a polarizing plate 5, and a first low-reflection layer 6. The display device body 81 is a structure in which the display panel 1, the touch panel 3, the polarizing plate 5, and the first low-reflection layer 6 are stacked in the stated order. The display panel 1 and the touch panel 3 are mutually joined by the adhesive 2, which is composed of an optically clear adhesive (OCA) for instance. The touch panel 3 and the polarizing plate 5 are mutually joined by the adhesive 4, which is composed of an OCA for instance.

Examples of the display panel 1 include an organic light-emitting-diode (OLED) display panel and a quantum-dot light-emitting-diode (QLED) display panel. The touch panel 3 is not limited to one attached on the display panel 1; the touch panel 3 may be an on-cell touch panel or an in-cell touch panel. The polarizing plate 5 is for preventing internal reflection in the display device 101.

The first low-reflection layer 6 is a layer undergone processing of low reflection. The first low-reflection layer 6 preferably has a surface reflectance of 0.3% or less per surface. XX % per surface means reflecting XX % of light that enters a surface.

Since the display device 101 is a bendable display device, the display device body 81 is bendable. The display device body 81 has a display surface 10. The display surface 10 is a surface on which the display device body 81 displays an image. The first low-reflection layer 6, which is the uppermost layer of the display device body 81, constitutes the display surface 10.

The cover member 82 covers the display surface 10 of the display device body 81. The cover member 82 has a second low-reflection layer 7, a window film 8, and a hard-coat layer 9. The cover member 82 is a structure in which the second low-reflection layer 7, the window film 8, and the hard-coat layer 9 are stacked in the stated order.

The second low-reflection layer 7 is a layer undergone processing of low reflection. The second low-reflection layer 7 preferably has a surface reflectance of 0.3% or less per surface.

An example of the window film 8 is a polyethylene terephthalate (PET) film. The hard-coat layer 9 is provided on the upper surface of the window film 8.

The first low-reflection layer 6 and the second low-reflection layer 7 face mutually. On the other hand, the first low-reflection layer 6 and the second low-reflection layer 7 are not fixed mutually in the bendable portion 91, and their relative positions are variable.

The first low-reflection layer 6 and the second low-reflection layer 7 may be fixed to, for instance, a support (not shown), such as a casing, provided in the display device 101. The hard-to-bend portion 92 may be provided with a spacer (not shown), and the first low-reflection layer 6 and the second low-reflection layer 7 may be fixed to this spacer for instance.

The display device 101 is configured such that the display device body 81 and the cover member 82 are fixed mutually in the bendable portion 91. Accordingly, the window film 8 can be prevented from receiving a compressive stress, and the hard-coat layer 9 can be prevented from receiving a tensile stress. This can prevent breakage in the window film 8 and hard-coat layer 9 and can prevent removal of the window film 8.

As such, the display device 101 can reduce the possibility of breakage of the cover member 82 or removal of the cover member 82 from the display surface 10 when the display device 101, which is bendable, is bent.

The first low-reflection layer 6 in the display device body 81 and the second low-reflection layer 7 in the cover member 82 face a gap 11 between the display device body 81 and cover member 82. This enables the difference between the light reflectance at an intimate-contact portion 12, where the display device body 81 and the cover member 82 are in intimate contact, and the light reflectance at a non-intimate-contact portion 13, where the display device body 81 and the cover member 82 are not in intimate contact, to be reduced in the bent state illustrated in FIG. 2. The intimate-contact portion 12 and the non-intimate-contact portion 13 are also respectively regarded as a portion where the gap 11 is not formed in the bent state, and a portion where the gap 11 is formed in the bent state. For instance, the difference between the light reflectance at the intimate-contact portion 12 and the light reflectance at the non-intimate-contact portion 13 is 0.4% or less per surface, which is considerably small. Hence, there is a low possibility that light reflected on the intimate-contact portion 12 and light reflected on the non-intimate-contact portion 13 are recognized individually by an observer of the display device 101. This can achieve the display device 101 of high display quality where display uniformity is high.

The gap 11 is a gap between the display device body 81 and the cover member 82, as earlier described; specifically, the gap 11 is a gap between the first low-reflection layer 6 and second low-reflection layer 7. In the non-bent state illustrated in FIG. 2, the width, W11, of the gap 11 in the stacking direction of the display device body 81 and cover member 82 needs to be greater than zero. On the other hand, the width W11 is preferably close to zero as much as possible. This is because that the entire thickness of the display device 101 becomes large by the width W11. Forming the width W11 brings a demerit: increase in the number of components, such as a spacer, and/or in the number of process steps. Further, although it is preferable that the first low-reflection layer 6 and second low-reflection layer 7 be not mutually fixed, and that their relative positions be variable in the hard-to-bend portion 92, like those in the bendable portion 91, it is not necessary for them to be unfixed.

Figure 3:
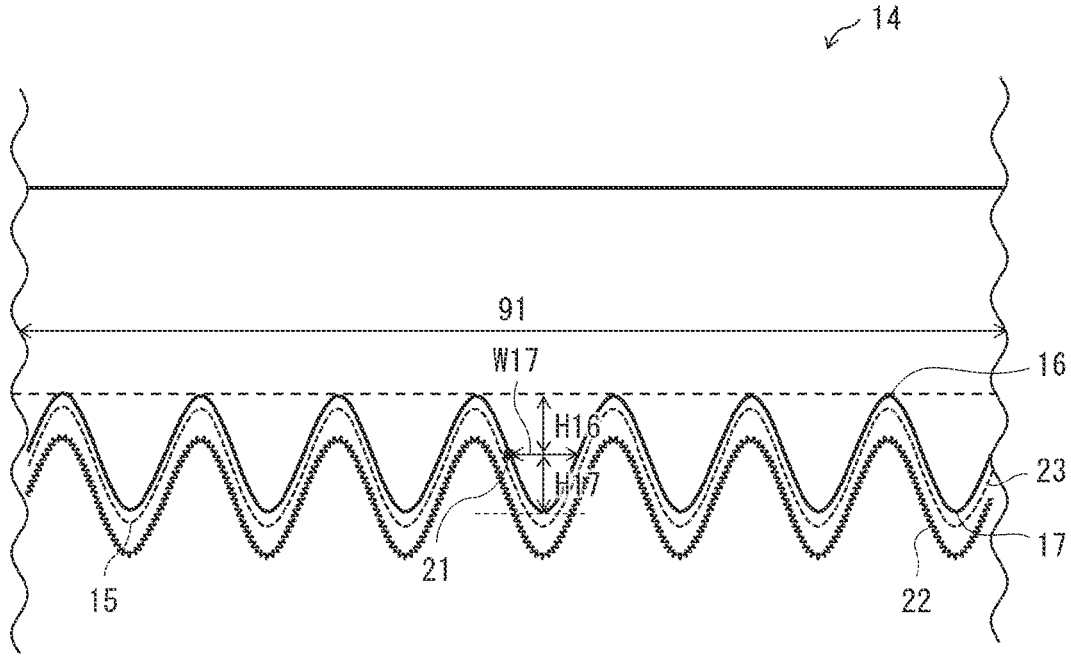
FIG. 3 is a sectional view of the schematic configuration of a low-reflection structure.

FIG. 3 is a sectional view of the schematic configuration of a low-reflection structure 14. The low-reflection structure 14 is an example of the first low-reflection layer 6. The low-reflection structure 14 is also an example of the second low-reflection layer 7. In other words, at least one of the first low-reflection layer 6 and second low-reflection layer 7 is composed of the low-reflection structure 14. The low-reflection structure 14 that is one of the first low-reflection layer 6 and second low-reflection layer 7 is a main low-reflection structure, and the other of the first low-reflection layer 6 and second low-reflection layer 7 is a secondary low-reflection structure. The secondary low-reflection structure is also preferably the low-reflection structure 14.

The low-reflection structure 14 preferably has a surface reflectance of 0.3% or less per surface, as earlier described. When being the main low-reflection structure, the low-reflection structure 14 has, on its surface facing the secondary low-reflection structure, an asperity pattern (first asperity pattern) 15 and a moth-eye structure (first moth-eye structure) 22 provided on the surface of the asperity pattern 15. When being the secondary low-reflection structure, the low-reflection structure 14 has, on its surface facing the main low-reflection structure, the asperity pattern (second asperity pattern) 15 and the moth-eye structure (second moth-eye structure) 22 provided on the surface of the asperity pattern 15. Further, the moth-eye structure 22 in the low-reflection structure 14 is provided in the form of a film with the moth-eye structure 22 formed, that is, in the form of a moth-eye film 23.

A moth-eye structure is also called a structure of moth's eyes and is a structure where asperity patterns of a pitch equal to or less than the wavelength of light (e.g., 380 nm) are arranged without gaps on the surface of a component that performs anti-reflection processing, to thus cause change in the refractive index at the boundary between the outside world (e.g., air) and component's surface to be continuous in a pseudo manner. A moth-eye structure allows almost all light to pass irrespective of a refractive index interface and can thus mostly eliminate light reflection on the component's surface.

As seen in FIG. 3, the asperity pattern 15 has recesses 16 and protrusions 17. The-asperity pattern 15 is formed at least in the bendable portion 91 and is formed in a direction perpendicular to the bending direction of the bendable portion 91, in other words, in a direction (the side-to-side direction in FIG. 3) where the ridges of the asperity pattern 15, which is stripe-shaped, are perpendicular to the bending side of the display device 101. On the other hand, the moth-eye structure 22 is formed at least in the bendable portion 91, and normally, the moth-eye structure 22 is further formed in the hard-to-bend portion 92.

A surface of the low-reflection structure 14 including the asperity pattern 15 and moth-eye structure 22 is a surface facing the other low-reflection structure 14. That is, a surface of the first low-reflection layer 6 adjacent to the cover member 82 (to be more specific, a surface facing the second low-reflection layer 7), and a surface of the second low-reflection layer 7 adjacent to the display device body 81 (to be more specific, a surface facing the first low-reflection layer 6) each include the asperity pattern 15 and the moth-eye structure 22.

Figure 4:
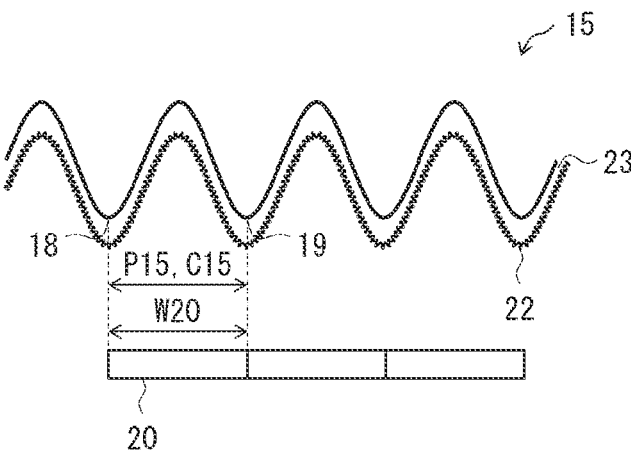
FIG. 4 schematically illustrates a relationship in a direction where an asperity pattern is arranged, between the shape of the asperity pattern and the shape of a pixel of the display device illustrated in FIG. 1.

FIG. 4 schematically illustrates a relationship in the direction where the asperity pattern 15 is arranged, between the shape of the asperity pattern 15 and the shape of a pixel 20 of the display device 101. The pixel 20 is formed in the display panel 1.

A pitch P15 of the asperity pattern 15 is specified in FIG. 4. The pitch P15 is defined as an interval between the vertex of a protrusion 18, which is one of two protrusions 17 adjacent to each other in the asperity pattern 15, and the vertex of a protrusion 19, which is the other protrusion 17. The pitch P15 is equal to an integral multiple of the width, W20, of a single pixel 20 (single pixel) of the display device 101 in the direction where the asperity pattern 15 is arranged. Although the pitch P15 and the width W20 are equal in FIG. 4; in other words, the pitch P15 is 1.0 times of the width W20, the pitch P15 may be more than double (herein, an integral multiple) the width W20.

The asperity pattern 15 in FIG. 4 has a sign-wave shaped surface in the sectional view (plane illustrated in FIG. 4) of the asperity pattern 15. A single period C15 of a sine wave constituting the sine-wave shaped surface is equal to the integral multiple of the width W20 of a single pixel 20 (single pixel) of the display device 101 in the direction where the asperity pattern 15 is arranged. Although the single period C15 and the width W20 are equal in FIG. 4; in other words, the single period C15 is 1.0 times of the width W20, the single period C15 may be more than double (herein, an integral multiple) the width W20.

Figure 5:
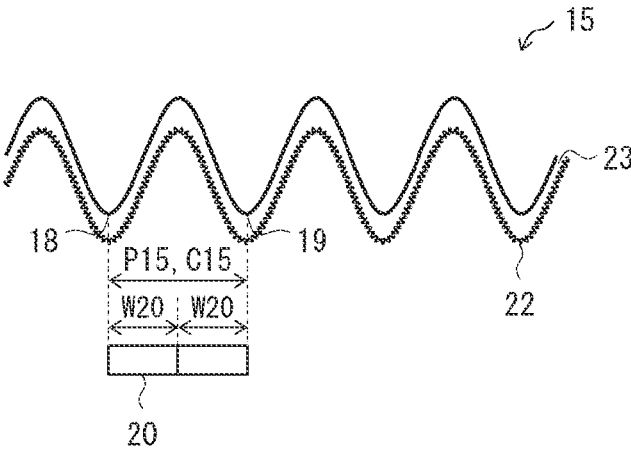
FIG. 5 schematically illustrates another relationship in the direction where the asperity pattern is arranged, between the shape of the asperity pattern and the shape of the pixel of the display device illustrated in FIG. 1.

FIG. 5 schematically illustrates another relationship in the direction where the asperity pattern 15 is arranged, between the shape of the asperity pattern 15 and the shape of the pixel 20 of the display device 101.

As illustrated in FIG. 5, each of the pitch P15 and single period C15 may be equal to 2 times of the width W20.

The display device 101, which has the pitch P15 and/or single period C15 equal to the integral multiple of the width W20, exerts the following effect. Viewing angle characteristics corresponding to many pixels 20 provided in the display device 101 are commonized for every many pixels 20, and consequently, the display device 101 of high display quality can be achieved where a change in the tinge of a display pixel is prevented.

It is noted that the positioning of the recess 16 and protrusion 17 in a single pixel 20 is not necessary. This is because that since the low-reflection structure 14 is provided sufficiently away from the display panel 1, light that enters the low-reflection structure 14 from a single pixel 20 is sufficiently diffused light; thus, such elaborated positioning is not so important.

The depth, H16, of the recess 16 in the height direction of the asperity pattern 15 measured from a reference point 21, and the height, H17, of the protrusion 17 in the height direction of the asperity pattern 15 measured from the reference point 21 are each preferably as large as the pitch P15. However, even if each of the depth H16 and height H17 is smaller than the pitch P15, low reflection is promising to some extent.

Each of the pitch P15, single period C15, depth H16, and height H17 may be different between the first low-reflection layer 6 and the second low-reflection layer 7.

It is difficult to directly process the asperity pattern 15 to form the moth-eye structure 22 when the depth H16 and/or height H17 is large. Accordingly, the moth-eye structure 22 is preferably formed in the moth-eye film 23 attached to the asperity pattern 15. That is, the first low-reflection layer 6 is preferably attached to the asperity pattern 15 and preferably has the moth-eye film 23 with the moth-eye structure 22 formed. Likewise, the second low-reflection layer 7 is preferably attached to the asperity pattern 15 and preferably has the moth-eye film 23 with the moth-eye structure 22 formed.

It is noted that a P15 of over 400 nm possibly causes coloring due to a blue wavelength component, but a pitch P15 of 300 nm or less prevents this effect sufficiently, and a pitch P15 of 200 nm or less has little effect. Further, the protrusion 17 preferably has an aspect ratio of 0.7 to 1.1 inclusive, and an aspect ratio of 0.9 to 1.1 inclusive is particularly effective. The height H17 is preferably 140 to 220 nm inclusive, and a height H17 of 180 to 220 nm inclusive is particularly effective. It is noted that the aspect ratio of the protrusion 17 is the ratio of the height H17 to the width, W17, of the base of the protrusion 17. That is, the aspect ratio corresponds to a value obtained by dividing the height H17 by the width W17 (a value of the height H17/the width W17).

Second Embodiment

Figure 6:
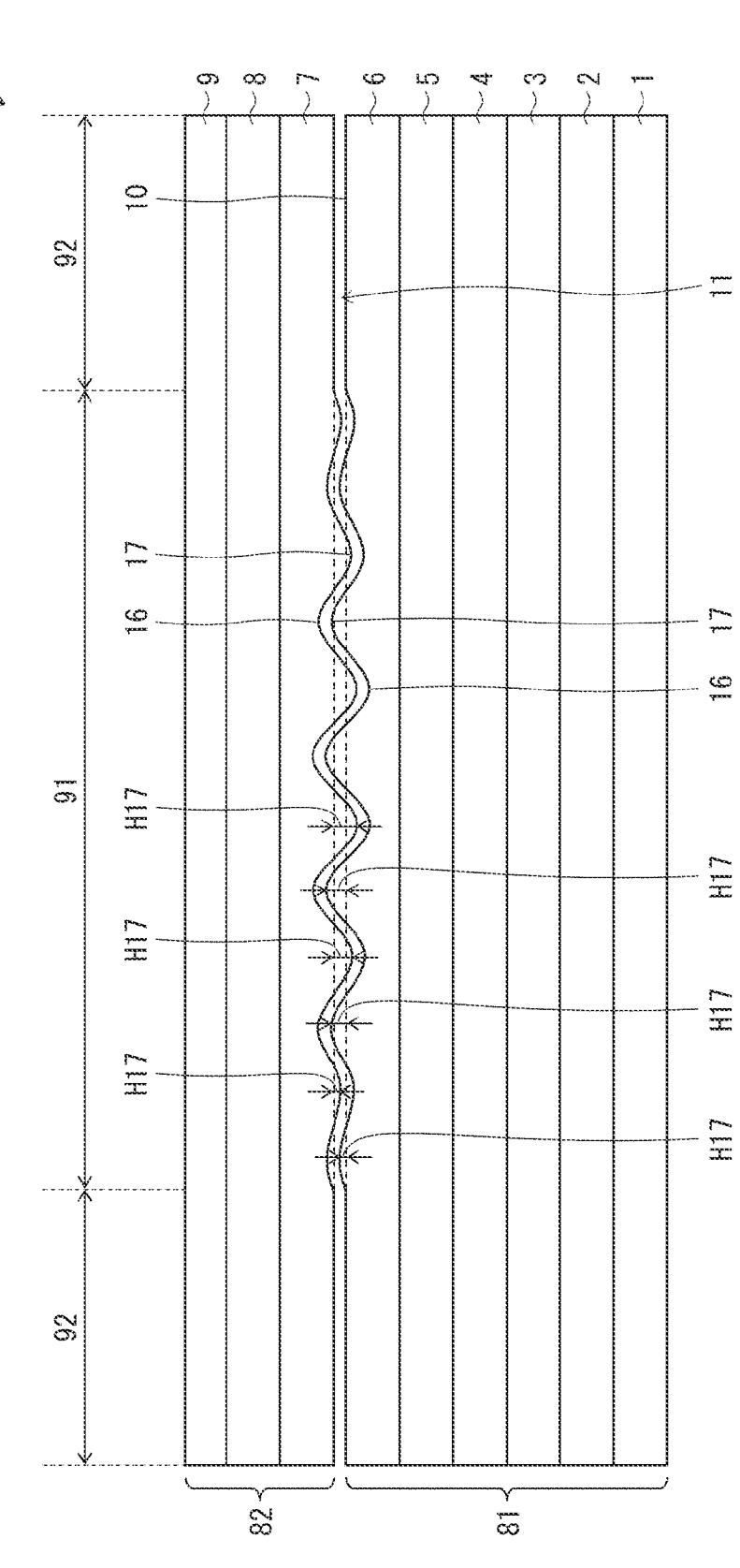
FIG. 6 is a sectional view of the schematic configuration of a display device according to a second embodiment of the disclosure.

FIG. 6 is a sectional view of the schematic configuration of a display device 102 according to this embodiment. For easy description, this embodiment addresses the illustration and description of FIG. 6 while ignoring the moth-eye structure 22 and moth-eye film 23.

The first low-reflection layer 6 in the display device 102 includes the foregoing asperity pattern 15. The asperity pattern 15 is provided in the bendable portion 91. The heights H17 of a plurality of protrusions 17 constituting the asperity pattern 15 decrease along with approach to the hard-to-bend portion 92. Further, the asperity pattern 15 is not provided in the hard-to-bend portion 92.

The second low-reflection layer 7 in the display device 102 includes the foregoing asperity pattern 15. The asperity pattern 15 is provided in the bendable portion 91. The heights H17 of the plurality of protrusions 17 constituting the asperity pattern 15 decrease along with approach to the hard-to-bend portion 92. Further, the asperity pattern 15 is not provided in the hard-to-bend portion 92.

The heights H17 decrease along with approach to the hard-to-bend portion 92; this can prevent an abrupt change in the light reflectance at, in particular, the boundary between the bendable portion 91 and hard-to-bend portion 92. Thus, there is a low possibility that light reflected on the bendable portion 91 and light reflected on the hard-to-bend portion 92 are recognized individually by an observer of the display device 102. This can achieve the display device 102 of high display quality where display uniformity is high.

SUMMARY

A display device according to a first aspect of the disclosure is a display device including a bendable portion that is bendable. The display device includes the following: a display device body having a display surface, and having a first low-reflection layer constituting the display surface; and a cover member covering the display surface, and having a second low-reflection layer facing the first low-reflection layer, wherein the relative positions of the first low-reflection layer and the second low-reflection layer are variable in the bendable portion, a main low-reflection structure has, on a surface facing a secondary low-reflection structure, a first asperity pattern and a first moth-eye structure provided on a surface of the first asperity pattern, the main low-reflection structure being one of the first low-reflection layer and the second low-reflection layer, the secondary low-reflection structure being another of the first low-reflection layer and the second low-reflection layer, the first asperity pattern has a first sine-wave shaped surface in a sectional view, and a single period of a sine wave constituting the first sine-wave shaped surface is equal to an integral multiple of the width of a single pixel of the display device in a direction where the first asperity pattern is arranged.

The display device according to a second aspect of the disclosure is configured, in the first aspect, such that the main low-reflection structure has a surface reflectance of 0.3% or less per surface.

The display device according to a third aspect of the disclosure is configured, in the first or second aspect, such that the first moth-eye structure is formed in a moth-eye film attached to the first asperity pattern.

The display device according to a fourth aspect of the disclosure is configured, in any one of the first to third aspects, such that the display device includes a hard-to-bend portion that is hard to bend, the first asperity pattern is provided in the bendable portion, and the heights of a plurality of protrusions constituting the first asperity pattern decrease along with approach to the hard-to-bend portion.

The display device according to a fifth aspect of the disclosure is configured, in the fourth aspect, such that the first asperity pattern is not provided in the hard-to-bend portion.

The display device according to a sixth aspect of the disclosure is configured, in any one of the first to fifth aspects, such that the secondary low-reflection structure has, on a surface facing the main low-reflection structure, a second asperity pattern and a second moth-eye structure provided on a surface of the second asperity pattern, the second asperity pattern has a second sine-wave shaped surface in a sectional view, and a single period of a sine wave constituting the second sine-wave shaped surface is equal to an integral multiple of the width of a single pixel of the display device in a direction where the second asperity pattern is arranged.

The disclosure is not limited to the foregoing embodiments. Various modifications can be devised within the scope of the claims. An embodiment that is obtained in combination as appropriate with the technical means disclosed in the respective embodiments is also included in the technical scope of the disclosure. Furthermore, combining the technical means disclosed in the respective embodiments can form a technical feature.

The invention claimed is:

1. A display device including a bendable portion that is bendable, comprising:
 a display device body having a display surface, and having a first low-reflection layer constituting the display surface; and
 a cover member covering the display surface, and having a second low-reflection layer facing the first low-reflection layer,
 wherein relative positions of the first low-reflection layer and the second low-reflection layer are variable in the bendable portion,
 a main low-reflection structure has, on a surface facing a secondary low-reflection structure, a first asperity pattern and a first moth-eye structure provided on a surface of the first asperity pattern, the main low-reflection structure being one of the first low-reflection layer and the second low-reflection layer, the secondary low-reflection structure being another of the first low-reflection layer and the second low-reflection layer,
 the first asperity pattern has a first sine-wave shaped surface in a sectional view, and
 a single period of a sine wave constituting the first sine-wave shaped surface is equal to an integral multiple of a width of a single pixel of the display device in a direction where the first asperity pattern is arranged.

2. The display device according to claim 1, wherein the main low-reflection structure has a surface reflectance of 0.3% or less per surface.

3. The display device according to claim 1, wherein the first moth-eye structure is formed in a moth-eye film attached to the first asperity pattern.

4. The display device according to claim 1, wherein
 the display device includes a hard-to-bend portion that is hard to bend,
 the first asperity pattern is provided in the bendable portion, and
 heights of a plurality of protrusions constituting the first asperity pattern decrease along with approach to the hard-to-bend portion.

5. The display device according to claim 4, wherein the first asperity pattern is not provided in the hard-to-bend portion.

6. The display device according to claim 1, wherein
 the secondary low-reflection structure has, on a surface facing the main low-reflection structure, a second asperity pattern and a second moth-eye structure provided on a surface of the second asperity pattern,
 the second asperity pattern has a second sine-wave shaped surface in a sectional view, and
 a single period of a sine wave constituting the second sine-wave shaped surface is equal to an integral multiple of a width of a single pixel of the display device in a direction where the second asperity pattern is arranged.

\* \* \* \* \*